United States Patent
Handa

(10) Patent No.: US 12,133,401 B2
(45) Date of Patent: Oct. 29, 2024

(54) LIGHT-EMITTING ELEMENT AND LIGHT-EMITTING DEVICE INCLUDING A LIGHT-EMITTING LAYER CONTAINING QUANTUM DOTS

(71) Applicant: SHARP KABUSHIKI KAISHA, Sakai (JP)

(72) Inventor: Shinichi Handa, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 464 days.

(21) Appl. No.: 17/617,276

(22) PCT Filed: Aug. 20, 2019

(86) PCT No.: PCT/JP2019/032410
§ 371 (c)(1),
(2) Date: Dec. 7, 2021

(87) PCT Pub. No.: WO2021/033257
PCT Pub. Date: Feb. 25, 2021

(65) Prior Publication Data
US 2022/0328778 A1 Oct. 13, 2022

(51) Int. Cl.
*H10K 50/115* (2023.01)
*H10K 50/15* (2023.01)
*H10K 102/00* (2023.01)

(52) U.S. Cl.
CPC ......... *H10K 50/115* (2023.02); *H10K 50/156* (2023.02); *H10K 2102/00* (2023.02)

(58) Field of Classification Search
CPC ............... H10K 50/115; H10K 50/156; H10K 2102/00; H10K 2101/30; H10K 50/15; H10K 2101/40; H10K 50/11; H05B 33/14
USPC .......................................................... 257/40
See application file for complete search history.

(56) References Cited

U.S. PATENT DOCUMENTS

| | | |
|---|---|---|
| 2007/0103068 A1 | 5/2007 | Bawendi et al. |
| 2012/0238047 A1 | 9/2012 | Bawendi et al. |
| 2012/0292595 A1 | 11/2012 | Bawendi et al. |
| 2017/0125635 A1 | 5/2017 | Bawendi et al. |
| 2018/0019371 A1* | 1/2018 | Steckel ............... H01L 27/1225 |

FOREIGN PATENT DOCUMENTS

JP 2012-023388 A 2/2012

* cited by examiner

Primary Examiner — Mohammad M Hoque
(74) Attorney, Agent, or Firm — ScienBiziP, P.C.

(57) ABSTRACT

A light-emitting element has the following: a cathode; an anode; a light-emitting layer disposed between the cathode and the anode, and containing quantum dots; and a hole transport layer disposed between the anode and light-emitting layer. The hole transport layer has a first region adjacent to the anode. The hole transport layer also has a second region closer to the light-emitting layer than the first region is. The second region adjoins to the light-emitting layer. The first region has an ionization potential larger than an ionization potential of the second region and larger than an ionization potential of the light-emitting layer.

16 Claims, 3 Drawing Sheets

FIG.3

| X | 1 | 0.75 | 0.5 | 0.25 | 0 |
|---|---|------|-----|------|---|
| IONIZATION POTENTIAL (eV) | 8.2 | 6.0 | 5.8 | 5.6 | 5.4 |
| ELECTRON AFFINITY (eV) | 0.4 | 1.7 | 1.8 | 1.9 | 2.0 |

FIG.4

| X | 1 | 0.75 | 0.5 | 0.25 | 0 |
|---|---|------|-----|------|---|
| IONIZATION POTENTIAL (eV) | 6.0 | 5.9 | 5.8 | 5.5 | 5.4 |
| ELECTRON AFFINITY (eV) | 3.7 | 3.3 | 2.9 | 2.4 | 2.0 |

FIG.5

| X | 1 | 0.75 | 0.5 | 0.25 | 0 |
|---|---|------|-----|------|---|
| IONIZATION POTENTIAL (eV) | 6.0 | 5.9 | 5.8 | 5.6 | 5.5 |
| ELECTRON AFFINITY (eV) | 3.7 | 3.6 | 3.5 | 3.4 | 3.3 |

FIG.6

| X | 1 | 0.75 | 0.5 | 0.25 | 0 |
|---|---|------|-----|------|---|
| IONIZATION POTENTIAL (eV) | 6.0 | 5.9 | 5.8 | 5.6 | 5.5 |
| ELECTRON AFFINITY (eV) | 3.7 | 3.8 | 3.9 | 4.0 | 4.1 |

LIGHT-EMITTING ELEMENT AND LIGHT-EMITTING DEVICE INCLUDING A LIGHT-EMITTING LAYER CONTAINING QUANTUM DOTS

TECHNICAL FIELD

The disclosure relates to a light-emitting element and a light-emitting device.

BACKGROUND ART

For instance, Patent Literature 1 discloses a light-emitting device that contains semiconductor nanocrystals. This literature describes that the light-emitting device includes a light-emitting element having a hole transport layer made of NiO, which is an inorganic material. The literature also describes that this configuration offers a long-life light-emitting device.

CITATION LIST

Patent Literature

Patent Literature 1: Japanese Patent Application Laid-Open No. 2012-23388

SUMMARY

Technical Problem

A light-emitting device that includes a light-emitting layer containing quantum dots needs to further enhance the efficiency of light emission by improving the configuration of its hole transport layer.

Solution to Problem

To solve the above problem, a light-emitting element according to one aspect of the disclosure has the following: a cathode; an anode; a light-emitting layer disposed between the cathode and anode, and containing quantum dots; and a hole transport layer disposed between the anode and light-emitting layer. The hole transport layer has a first region adjacent to the anode. The hole transport layer also has a second region closer to the light-emitting layer than the first region is. The second region adjoins to the light-emitting layer. The first region has an ionization potential larger than the ionization potential of the second region and larger than the ionization potential of the light-emitting layer.

To solve the above problem, a light-emitting element according to one aspect of the disclosure has the following: an anode; a cathode; a light-emitting layer disposed between the anode and cathode, and containing quantum dots; and a hole transport layer disposed between the anode and light-emitting layer. The hole transport layer includes a metal oxide containing Ni. The hole transport layer has a first region adjacent to the anode. The hole transport layer also has a second region closer to the light-emitting layer than the first region is. The second region adjoins to the light-emitting layer. The ratio of O to Ni in the first region is larger than the ratio of O to Ni in the second region.

Advantageous Effect of Disclosure

With the above configurations, a light-emitting element that includes a light-emitting layer containing quantum dots improves the efficiency of hole transport from its hole transport layer to its light-emitting layer. This improves a hole-and-electron carrier balance in the light-emitting layer, thus offering a light-emitting device with enhanced efficiency of light emission while maintaining the reliability of the light-emitting device.

BRIEF DESCRIPTION OF DRAWINGS

FIG. 3 illustrates the relationship between ionization potential and electron affinity for the composition of $Mg_xNi_{1-x}O$.

FIG. 4 illustrates the relationship between ionization potential and electron affinity for the composition of $(NiO)_{1-x}(LaNiO_3)_x$.

FIG. 5 illustrates the relationship between ionization potential and electron affinity for the composition of $(Cu_2O)_{1-x}(LaNiO_3)_x$.

FIG. 6 illustrates the relationship between ionization potential and electron affinity for the composition of $(CuO)_{1-x}(LaNiO_3)_x$.

DESCRIPTION OF EMBODIMENTS

Illustrative embodiments of the disclosure will be described with reference to the drawings. The following description defines the direction from a light-emitting element 3 to an array substrate 2, both included in a light-emitting device 1, as "bottom", and the direction from the array substrate 2 to light-emitting element 3 of the light-emitting device 1 as "top". Moreover, like components will be denoted by the same signs throughout the drawings, and their description will be omitted.

First Embodiment

Figure 1:
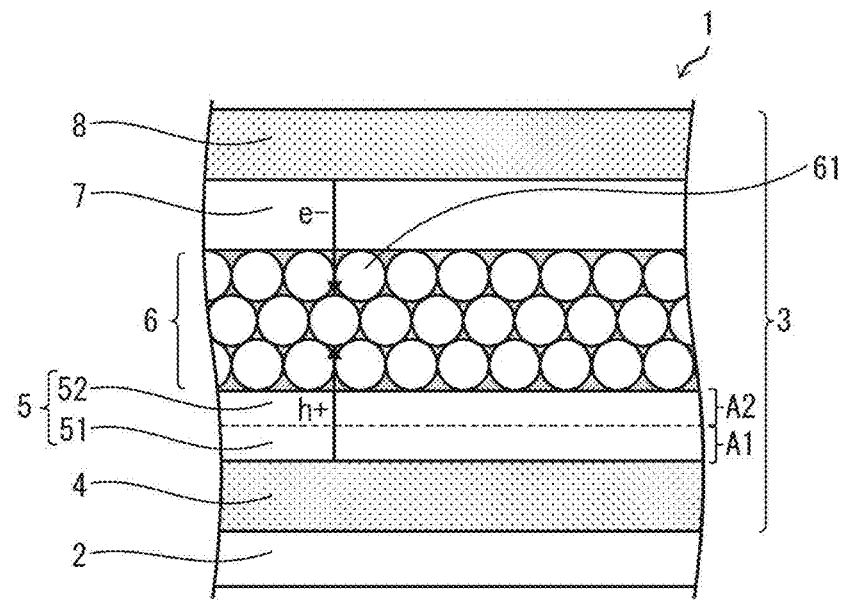
FIG. 1 is a schematic sectional view of a light-emitting device according to a first embodiment.

FIG. 1 is a schematic sectional view of a light-emitting device 1 according to a first embodiment. The light-emitting device 1 is used in a display device, such as a display, for instance. As illustrated in FIG. 1, the light-emitting device 1 in this embodiment has an array substrate 2 and light-emitting elements 3. The light-emitting device 1 is structured such that layers of each light-emitting element 3 are stacked on the array substrate 2, on which thin-film transistors or TFTs (not shown) that drive the light-emitting elements 3 are disposed. The light-emitting element 3 in this embodiment has an anode 4, a hole transport layer 5, a light-emitting layer 6, an electron transport layer 7, and a cathode 8.

The anode 4 is stacked on the upper layer of the array substrate 2 and is electrically connected to a TFT on the array substrate 2. The anode 4 includes the following materials sequentially stacked on the array substrate 2: a metal containing, but not limited to, Al, Cu, Au or Ag, all of which highly reflect visible light; and a transparent material, such as ITO, IZO, ZnO, AZO or BZO. The anode 4 is formed through, but not limited to, sputtering or evaporation.

The hole transport layer 5 transports holes injected from the anode 4 further to the light-emitting layer 6. The hole transport layer 5 is stacked on the anode 4 and is electrically connected to the anode 4. The hole transport layer 5 is made of a material including a metal oxide for instance. Examples of the metal oxide contained in the hole transport layer 5 include magnesium nickel oxide or MgNiO (a compound containing Mg, Ni, and O), lanthanum nickel oxide or LaNiO (a compound containing La, Ni, and O), $Mg_XNi_{1-X}O$ (where X satisfies $0 \leq X \leq 1$), $(NiO)_{1-X}(LaNiO_3)_X$ (where X satisfies $0 \leq X \leq 1$), and $(Cu_YO)_{1-X}(LaNiO_3)_X$ (where X satisfies $0 \leq X \leq 1$, where Y satisfies $1 \leq Y \leq 2$). The hole transport layer 5 is formed through, but not limited to, sputtering, evaporation, spin coating or ink jetting. In some embodiments, the hole transport layer 5 may be composed of nanoparticles, crystals, polycrystals, or amorphous substances.

The hole transport layer 5 preferably has a thickness of 5 to 50 nm inclusive. Such a thickness enables the hole transport layer 5 to be formed uniformly. Such a thickness also enables stable and efficient hole transport to the light-emitting layer 6 while preventing effects of unexpected tunnel injection and other phenomena. The configuration of the hole transport layer 5 will be detailed later on.

The light-emitting layer 6 is disposed between the anode 4 and cathode 8. To be specific, the light-emitting layer 6 in this embodiment is disposed between the hole transport layer 5 and electron transport layer 7. The light-emitting layer 6 in this embodiment contains quantum dots (semiconductor nanoparticles) 61. To be specific, the light-emitting layer 6 has one or more laminated layers of the quantum dots 61. The light-emitting layer 6 is formed through, but not limited to, spin coating or ink jetting using a solution containing the quantum dots 61 dispersed in a solvent, such as hexane or toluene. This dispersed solution may be mixed with a dispersive material, such as thiol or amine. The light-emitting layer 6 preferably has a thickness of 5 to 50 nm inclusive so as to be formed uniformly and to emit light efficiently.

The quantum dots 61 are light-emitting materials having a valence band level and a conduction band level; a hole of the valence band level and an electron of the conduction band level rejoin together, thus emitting light. Quantum confinement causes light emitted from the quantum dots 61 to have a narrow spectrum, thus enabling light of relatively deep chromaticity to be obtained.

The quantum dots 61 may be semiconductor nanoparticles each having a core-and-shell structure consisting of, for instance, a CdSe core and a ZnS shell. Alternatively, the quantum dots 61 may have a core-and-shell structure consisting of a CdSe core and a CdS shell, of an InP core and a ZnS shell, of a ZnSe core and a ZnS shell, or of a CIGS core and a ZnS shell. Further, the outermost layers of the shells may coordinate with ligands composed of organic substances, such as thiol and amine.

The quantum dots 61 each have a particle diameter of about 3 to 15 nm. The particle diameter of the quantum dots 61 can regulate the wavelength of light emitted from the quantum dots 61. Accordingly, controlling the particle diameter of the quantum dots 61 can regulate the wavelength of light emitted by the light-emitting device 1.

The electron transport layer 7 transports holes injected from the cathode 8 further to the light-emitting layer 6. The electron transport layer 7 may have the function of preventing hole transport to the cathode 8 (a hole blocking function). The electron transport layer 7 in this embodiment is disposed on the light-emitting layer 6. The electron transport layer 7 may contain, but not limited to, ZnO, $TiO_2$, $Ta_2O_3$, or $SrTiO_3$, and may be formed through sputtering. The electron transport layer 7 preferably has a thickness of 10 to 100 nm inclusive so as to be formed uniformly and to transport electrons efficiently to the light-emitting layer 6.

The cathode 8 is disposed on the electron transport layer 7 and is electrically connected to the electron transport layer 7. The cathode 8 is composed of, for instance, a metal thin film having light transparency or a transparent material. Examples of the metal contained in the cathode 8 include Al, Ag, and Mg. Examples of the transparent material contained in the cathode 8 include ITO, IZO, ZnO, AZO, and BZO. The cathode 8 is formed through, for instance, sputtering or evaporation.

Holes (arrow $h^+$ in FIG. 1) injected from the anode 4 are transported to the light-emitting layer 6 via the hole transport layer 5, and electrons (arrow $e^-$ in FIG. 1) injected from the cathode 8 are transported to the light-emitting layer 6 via the electron transport layer 7. The holes and electrons transported to the light-emitting layer 6 rejoin together within the quantum dots 61, thus generating excitons. The excitons then change from an excitation state back to a ground state, and thus the quantum dots 61 emit light. The light-emitting device 1 in this embodiment is a top-emission type, where light emitted from the light-emitting layer 6 is taken out via the opposite side of the array substrate 2 (i.e., from above in FIG. 1). In some embodiments, the light-emitting device 1 may be a bottom-emission type, where light is taken out via the array substrate 2 (i.e., from below in FIG. 1). In this case, the cathode 8 needs to be a reflective electrode, and the anode 4 needs to be a transparent electrode.

The light-emitting device 1 in this embodiment includes the following stacked sequentially on the array substrate 2: the anode 4, the hole transport layer 5, the light-emitting layer 6, the electron transport layer 7, and the cathode 8. In some embodiments, the structure of the light-emitting device 1 may be inverted; that is, the cathode 8, the electron transport layer 7, the light-emitting layer 6, the hole transport layer 5, and the anode 4 may be stacked sequentially on the array substrate 2.

Figure 2:
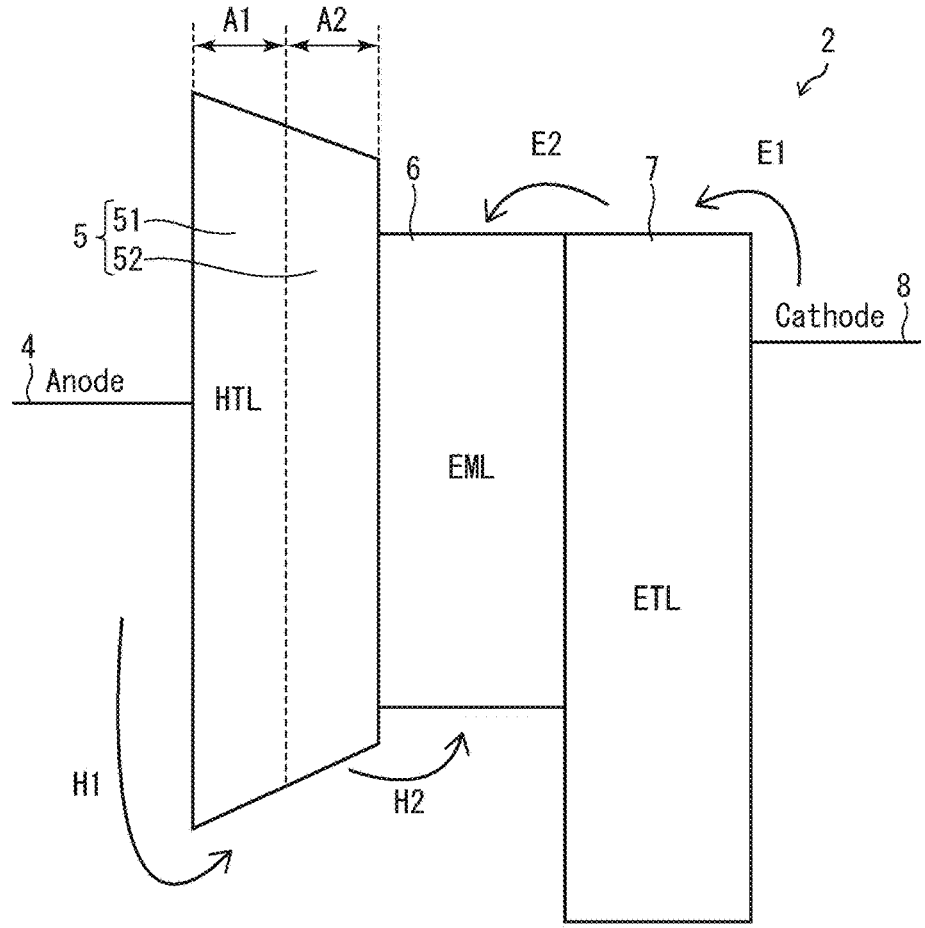
FIG. 2 illustrates energy indicating electron affinity and ionization potential in each layer of a light-emitting element according to the first embodiment.

The configuration of the light-emitting element 3 will be described in view of the relationship in energy between its layers. FIG. 2 illustrates energy indicating the relationship between Fermi level, electron affinity and ionization potential in each layer of the light-emitting element 3 according to the first embodiment. FIG. 2 shows the anode 4, the hole transport layer 5, the light-emitting layer 6, the electron transport layer 7, and the cathode 8, which are arranged from the left to the right. In FIG. 2, the anode 4, the hole transport layer 5, the light-emitting layer 6, the electron transport layer 7, and the cathode 8 are respectively denoted as Anode, HTL, EML, ETL, and Cathode.

The example in FIG. 2 illustrates the anode 4 and cathode 8 shown with Fermi level. In addition, below the hole transport layer 5, light-emitting layer 6 and electron transport layer 7 is the ionization potential of each layer illustrated with reference to vacuum level. In addition, above the hole transport layer 5, light-emitting layer 6 and electron transport layer 7 is the electron affinity of each layer illustrated with reference to vacuum level. The Fermi levels, the ionization potentials, the electron affinities will be denoted by the unit eV. The Specification will hereinafter describe ionization potential or electron affinity with reference to vacuum level.

FIG. 2 illustrates, by way of example, the anode 4 made of ITO, and the cathode 8 made of Al. In this case, the anode 4 has a Fermi level of 4.6 eV, and the cathode 8 has a Fermi level of 4.3 eV. FIG. 2 also illustrates, by way of example, the electron transport layer 7 made of ZnO. In this case, the electron transport layer 7 has an ionization potential of 7.4 eV and an electron affinity of 4.0 eV. FIG. 2 also illustrates, by way of example, the light-emitting layer 6 having an ionization potential of 6.0 to 7.0 eV and an electron affinity of 3.5 to 4.0 eV. When the quantum dots 61 within the light-emitting layer 6 are made of CdSe for instance, the light-emitting layer 6 has an ionization potential of 5.5 eV. Further, when the quantum dots 61 within the light-emitting layer 6 are made of InP for instance, the light-emitting layer 6 has an ionization potential of 5.6 eV. Still further, when the quantum dots 61 within the light-emitting layer 6 are made of ZnSe for instance, the light-emitting layer 6 has an ionization potential of 5.7 eV. It is noted that controlling the particle diameter or material of the quantum dots 61 can regulate the ionization potential and electron affinity of the light-emitting layer 6.

Upon occurrence of a potential difference between the anode 4 and cathode 8 in the light-emitting element 3, holes are injected from the anode 4 into the hole transport layer 5, as indicated by arrow H1 in FIG. 2. Likewise, electors are injected from the cathode 8 into the electron transport layer 7, as indicated by arrow E1 in FIG. 2. The holes are then transported from the hole transport layer 5 to the light-emitting layer 6, as indicated by arrow H2 in FIG. 2. Likewise, the electors are then transported from the electron transport layer 7 into the light-emitting layer 6, as indicated by arrow E2 in FIG. 2. The holes and electrons transported into the light-emitting layer 6 rejoin together in the quantum dots 61 in this way.

As illustrated in FIGS. 1 and 2, the hole transport layer 5 in this embodiment has a first region A1 and a second region A2. The first region A1 is adjacent to the anode 4. The second region A2 is closer to the light-emitting layer 6 than the first region A1 is, and adjoins to the light-emitting layer 6. To be specific, the first region A1 in this embodiment is disposed between the anode 4 and second region A2, and adjoins to the anode 4 and second region A2. In addition, the second region A2 in this embodiment is disposed between the first region A1 and light-emitting layer 6, and adjoins to the first region A1 and light-emitting layer 6. That is, the hole transport layer 5 in this embodiment consists of only the first region A1 and second region A2. In some embodiments, the hole transport layer 5 may further have another region between the anode 4 and first region A1; alternatively, the hole transport layer 5 may further have another region between the first region A1 and second region A2; alternatively, the hole transport layer 5 may further have another region between the second region A2 and light-emitting layer 6. These other regions are preferably provided for transporting holes from the anode 4 into the light-emitting layer 6 through tunneling.

The first region A1 has an ionization potential larger than the ionization potential of the second region A2 and larger than the ionization potential of the light-emitting layer 6. To be specific, the hole transport layer 5 in this embodiment has an ionization potential decreasing gradually from near the anode 4 in the first region A1 to near the light-emitting layer 6 in the second region A2, as illustrated in FIG. 2. To be more specific, the ionization potential of the hole transport layer 5 in this embodiment decreases gradually from near the anode 4 to near the light-emitting layer 6.

The above configuration facilitates transport from the hole transport layer 5 to the light-emitting layer 6. The light-emitting layer 6 is thus supplied with holes enough for electrons, thus improving the carrier balance between the holes and electrons and enhancing the efficiency of light emission in the light-emitting device 1. In addition, holes within the hole transport layer 5 easily undergo acceleration toward the light-emitting layer 6. The accelerated holes easily reach the deeper inside of the light-emitting layer 6. This prevents rejoining that does not contribute to light emission, at the interface between the hole transport layer 5 and light-emitting layer 6. Holes injected from the anode 4 can thus rejoin electrons efficiently within the light-emitting layer 6, thus enhancing the efficiency of light emission in the light-emitting device 1.

The second region A2 in this embodiment may have an ionization potential smaller than the ionization potential of the first region A1 and smaller than the ionization potential of the light-emitting layer 6. Setting the second region A2 at an ionization potential larger than the ionization potential of the light-emitting layer 6 lowers an energy barrier for hole transport between the hole transport layer 5 and light-emitting layer 6. This facilitates the transport of holes to the light-emitting layer 6. In addition, the holes easily reach the deeper inside of the light-emitting layer 6. The efficiency of light emission in the light-emitting device 1 can thus enhance.

Let the ionization potential of the second region A2 be defined as $IP_{A2}$, and let the ionization potential of the light-emitting layer 6 be defined as $IP_{EML}$. To enhance the efficiency of light emission in the light-emitting device 1, $IP_{A2}$ and $IP_{EML}$ preferably satisfy $IP_{A2}-IP_{EML} \geq -0.3$ eV. To also enhance the efficiency of light emission in the light-emitting device 1, the ionization potential of the second region A2 is more preferably larger than the ionization potential of the light-emitting layer 6. To inject holes efficiently from the anode 4, the first region A1 preferably has an ionization potential equal to or less than 6.5 eV.

The hole transport layer 5 in this embodiment also includes a first layer 51 including the first region A1, and a second layer 52 including the second region A2. The first layer 51 and the second layer 52 each preferably have a thickness of 5 to 15 nm inclusive. This enables the first layer 51 and second layer 52 to be formed uniformly This further enables stable and efficient hole transport to the light-emitting layer 6 while preventing effects of unexpected tunnel injection and other phenomena.

In the hole transport layer 5 in this embodiment, the first region A1 has an electron affinity smaller than the electron affinity of the second region A2, as illustrated in FIG. 2. To be specific, the hole transport layer 5 in this embodiment has an electron affinity increasing gradually from near the anode 4 in the first region A1 to near the light-emitting layer 6 in the second region A2. To be more specific, the electron affinity of the hole transport layer 5 increases gradually from near the anode 4 to near the light-emitting layer 6. This offers a large barrier for electrons to conduct from the light-emitting layer 6 to the anode 4. The electrons are thus prevented from conduction to the anode 4 and thus easily accumulate within the light-emitting layer 6. This enables electrons injected from the cathode 8 to rejoin holes efficiently within the light-emitting layer 6, thereby further enhancing the efficiency of light emission in the light-emitting device 1.

The specific configuration of the hole transport layer 5 will be described. As earlier described, the hole transport layer 5 in this embodiment is composed of a metal oxide, such as $Mg_XNi_{1-X}O$ (where X satisfies $0 \le X \le 1$), $(NiO)_{1-X}(LaNiO_3)_X$ (where X satisfies $0 \le X \le 1$), or $(Cu_YO)_{1-X}(LaNiO_3)_X$ (where X satisfies $0 \le X \le 1$, where Y satisfies $1 \le Y2$).

Reference is firstly made to an instance where the metal oxide contained in the hole transport layer 5 is $Mg_XNi_{1-X}O$. FIG. 3 illustrates the relationship between ionization potential and electron affinity for the composition of $Mg_XNi_{1-X}O$.

In $Mg_XNi_{1-X}O$, FIG. 3 shows that the ionization potential decreases from 8.2 eV to 5.4 eV as X decreases from 1 to 0, and that the electron affinity increases from 0.4 eV to 2.0 eV as X decreases from 1 to 0. The hole transport layer 5 that uses $Mg_XNi_{1-X}O$ with its composition changed in this way can control the ionization potential and electron affinity. Accordingly, in the hole transport layer 5, setting X in the first region A1 at a value larger than the value of X in the second region A2 enables the ionization potential of the first region A1 to be larger than the ionization potential of the second region A2. In addition, setting X in the first region A1 at a value larger than the value of X in the second region A2 enables the electron affinity of the first region A1 to be smaller than the electron affinity of the second region A2.

As earlier described, when the quantum dots 61 within the light-emitting layer 6 are made of CdSe for instance, the light-emitting layer 6 has an ionization potential of 5.5 eV. Further, when the quantum dots 61 within the light-emitting layer 6 are made of InP for instance, the light-emitting layer 6 has an ionization potential of 5.6 eV. Still further, when the quantum dots 61 within the light-emitting layer 6 are made of ZnSe for instance, the light-emitting layer 6 has an ionization potential of 5.7 eV. In this case, the hole transport layer 5 that uses $Mg_XNi_{1-X}O$, where the value of X ranges from 1 to 0.5, can have a greater ionization potential than the light-emitting layer 6.

The hole transport layer 5 that uses $Mg_XNi_{1-X}O$ with the value of X decreasing gradually from near the anode 4 in the first region A1 to near the light-emitting layer 6 in the second region A2 can have an ionization potential that decreases gradually from near the anode 4 in the first region A1 to near the light-emitting layer 6 in the second region A2. In addition, the hole transport layer 5 with the value of X decreasing gradually from near the anode 4 to near the light-emitting layer 6 can have an ionization potential that decreases gradually from near the anode 4 to near the light-emitting layer 6.

The hole transport layer 5 that uses $Mg_XNi_{1-X}O$ with the value of X decreasing gradually from near the anode 4 in the first region A1 to near the light-emitting layer 6 in the second region A2 can have an electron affinity that increases gradually from near the anode 4 in the first region A1 to near the light-emitting layer 6 in the second region A2. In addition, the hole transport layer 5 with the value of X decreasing gradually from near the anode 4 to near the light-emitting layer 6 can have an electron affinity that increases gradually from near the anode 4 to near the light-emitting layer 6.

Reference is next made to an instance where the metal oxide within the hole transport layer 5 is $(NiO)_{1-X}(LaNiO_3)_X$, and to an instance where this metal oxide is $(Cu_YO)_{1-X}(LaNiO_3)_X$. FIG. 4 illustrates the relationship between ionization potential and electron affinity for the composition of $(NiO)_{1-X}(LaNiO_3)_X$. FIG. 5 illustrates the relationship between ionization potential and electron affinity for the composition of $(Cu_2O)_{1-X}(LaNiO_3)_X$. FIG. 6 illustrates the relationship between ionization potential and electron affinity for the composition of $(CuO)_{1-X}(LaNiO_3)_X$.

In $(NiO)_{1-X}(LaNiO_3)_X$, FIG. 4 shows that the ionization potential decreases from 6.0 eV to 5.4 eV as X decreases from 1 to 0. Further in $(Cu_YO)_{1-X}(LaNiO_3)_X$, FIGS. 5 and 6 show that the ionization potential decreases from 6.0 eV to 5.5 eV as X decreases from 1 to 0. As such, even the hole transport layer 5 that uses $(NiO)_{1-X}(LaNiO_3)_X$ or $(Cu_YO)_{1-X}(LaNiO_3)_X$ with its composition changed can control the ionization potential, like the foregoing instance with reference to $Mg_XNi_{1-X}O$. In the composition of a Ni-containing metal oxide, decreasing the ratio of O to Ni gradually enables such control that the ionization potential decreases, as described using the foregoing example. That is, when a Ni-containing metal oxide is used for the hole transport layer 5, the ratio of O to Ni is larger in the first region A1 than that in the second region A2.

As described above, the hole transport layer 5 that uses a metal oxide with its composition changed can enhance the efficiency of light emission in the light-emitting device 1. Moreover, metal oxides are stable for oxygen and water. Hence, the hole transport layer 5 that uses such metal oxides as described above can enhance the reliability of the light-emitting device 1.

It is noted that the foregoing ionization potentials and electron affinities can be measured by photoelectron spectroscopy for instance.

Second Embodiment

A second embodiment will be next described. The second embodiment will describe mainly differences between the first and second embodiments and will not describe their redundancies. The second embodiment is different from the first embodiment in the configuration of the hole transport layer 5 of the light-emitting element 3.

Figure 7:
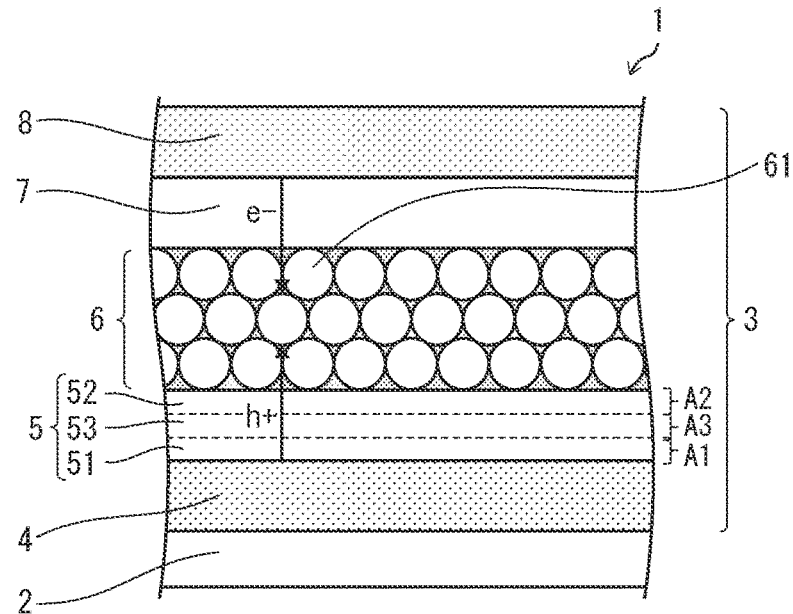
FIG. 7 is a schematic sectional view of a light-emitting device according to a second embodiment.
Figure 8:
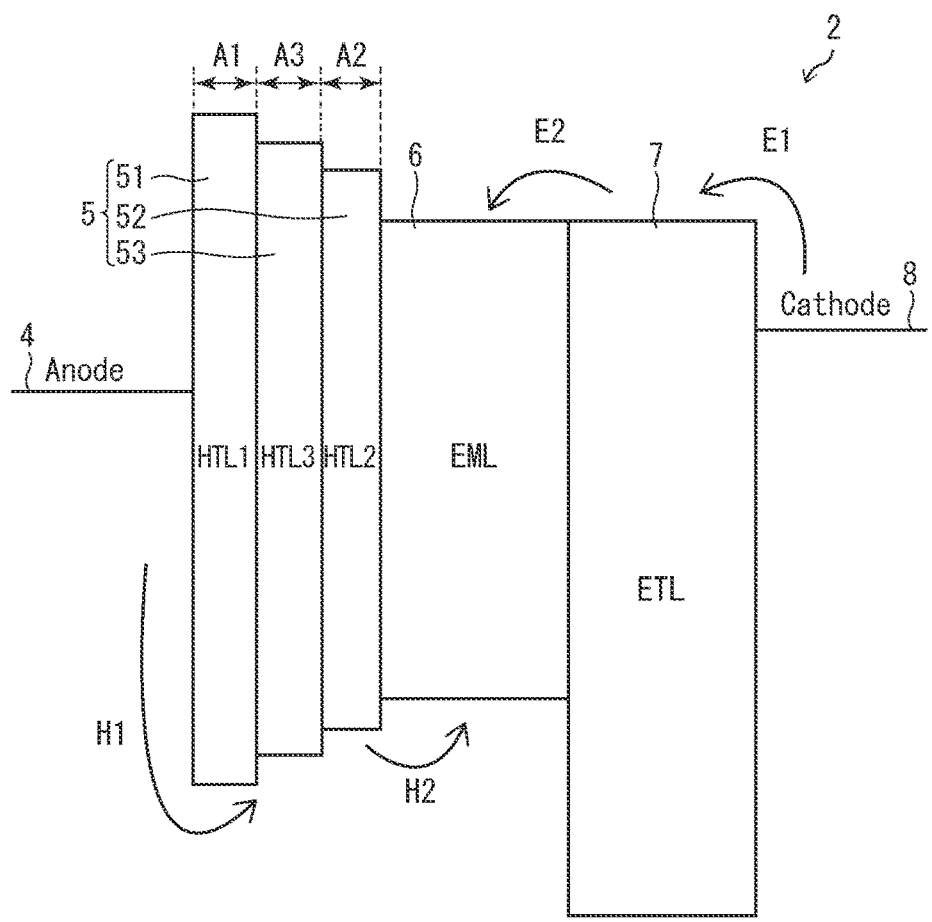
FIG. 8 illustrates energy indicating electron affinity and ionization potential in each layer of a light-emitting element according to the second embodiment.

FIG. 7 is a schematic sectional view of the light-emitting device 1 according to the second embodiment. FIG. 8 illustrates energy indicating electron affinity and ionization potential in each layer of the light-emitting element 3 according to the second embodiment. As illustrated in FIGS. 7 and 8, the light-emitting device 1 in this embodiment includes the array substrate 2 and the light-emitting elements 3. Each light-emitting element 3 in this embodiment has the anode 4, the hole transport layer 5, the light-emitting layer 6, the electron transport layer 7, and the cathode 8.

The hole transport layer 5 in this embodiment has the first region A1, the second region A2, and a third region A3. The first region A1 is adjacent to the anode 4. In addition, the second region A2 is closer to the light-emitting layer 6 than the first region A1 is, and adjoins to the light-emitting layer 6. The third region A3 is disposed between the first region A1 and second region A2.

The third region A3 has an ionization potential larger than the ionization potential of the second region A2 and smaller than the ionization potential of the first region A1. To be specific, the hole transport layer 5 in this embodiment has an ionization potential decreasing gradually from the first region A1 to the third region A3 to the second region A2, as illustrated in FIG. 8. To be more specific, the ionization potential of the hole transport layer 5 in this embodiment decreases gradually from near the anode 4 to near the light-emitting layer 6. To be more specific, the ionization potential of the hole transport layer 5 in this embodiment decreases stepwise from near the anode 4 to near the light-emitting layer 6.

The light-emitting layer 6 even in this configuration is supplied with holes enough for electrons, thus improving the carrier balance between the holes and electrons and enhancing the efficiency of light emission in the light-emitting device 1. In addition, holes within the hole transport layer 5 easily undergo acceleration toward the light-emitting layer 6. The accelerated holes easily reach the inside of the light-emitting layer 6. This prevents rejoining that does not contribute to light emission, at the interface between the hole transport layer 5 and light-emitting layer 6. Holes injected from the anode 4 can thus rejoin electrons efficiently within the light-emitting layer 6, thus enhancing the efficiency of light emission in the light-emitting device 1.

The hole transport layer 5 in this embodiment also includes the first layer 51 (HTL1 in FIG. 8) including the first region A1, the second layer 52 (HTL2 in FIG. 8) including the second region A2, and a third layer 53 (HTL3 in FIG. 8) including the third region A3. The first layer 51, the second layer 52, and the third layer 53 each preferably have a thickness of 5 to 15 nm inclusive. This enables the first layer 51, second layer 52 and third layer 53 to be formed uniformly. This further enables stable and efficient hole transport to the light-emitting layer 6 while preventing effects of unexpected tunnel injection and other phenomena. In addition, the hole transport layer 5, which can be formed by merely simply stacking materials having different ionization potentials, can be formed easily.

In the hole transport layer 5 in this embodiment, the third region A3 has an electron affinity larger than the electron affinity of the first region A1 and smaller than the electron affinity of the second region A2, as illustrated in FIG. 8. To be specific, the hole transport layer 5 in this embodiment has an electron affinity increasing gradually from the first region A1 to the third region A3 to the second region A2. To be more specific, the electron affinity of the hole transport layer 5 increases gradually from near the anode 4 to near the light-emitting layer 6. This offers a large barrier for electrons to conduct from the light-emitting layer 6 to the anode 4. The electrons are thus prevented from conduction to the anode 4 and thus easily accumulate within the light-emitting layer 6. Even this configuration enables electrons injected from the cathode 8 to rejoin holes efficiently within the light-emitting layer 6, thereby further enhancing the efficiency of light emission in the light-emitting device 1.

Modifications

Although the foregoing has described main embodiments of the disclosure, the disclosure is not limited to these embodiments.

FIG. 2, which relates to the first embodiment, has illustrated an instance where the ionization potential of the hole transport layer 5 decreases linearly from near the anode 4 to near the light-emitting layer 6. In some embodiments, the ionization potential of the hole transport layer 5 may decrease stepwise or in a curved line from near the anode 4 to near the light-emitting layer 6. Even such a configuration can enhance the efficiency of light emission in the light-emitting device 1.

The first embodiment has described that the hole transport layer 5 consists of the first region A1 and second region A2. In some embodiments, the hole transport layer 5 may include another region between the first region A1 and anode 4. In addition, this other region may have an ionization potential larger or smaller than the ionization potential of the first region A1.

The second embodiment has described that the hole transport layer 5 consists of three layers: the first layer 51, second layer 52 and third layer 53, and that the ionization potential of the hole transport layer 5 decreases gradually from near the anode 4 to near the light-emitting layer 6. In some embodiments, the hole transport layer 5 may consist of four or more layers, and the ionization potential of the hole transport layer 5 may decrease gradually from near the anode 4 to near the light-emitting layer 6.

In some embodiments, a region capable of blocking electrons may be provided between the second region A2 and light-emitting layer 6 in the foregoing embodiments. The region between the second region A2 and light-emitting layer 6 in this case may contain an inorganic material, such as $Al_2O_3$, $SiO_2$, or SiN, or may contain an organic material, such as PVK, TFB, or poly-TPD. This achieves efficient hole transport to the light-emitting layer 6 and also prevents electron leakage toward the anode 4, thereby enhancing the efficiency of light emission in the light-emitting device 1.

The individual components described in the foregoing embodiments and modifications may be combined as necessary, unless otherwise contradicted.

The invention claimed is:

1. A light-emitting element comprising:
   an anode;
   a cathode;
   a light-emitting layer disposed between the anode and the cathode, the light-emitting layer containing quantum dots; and
   a hole transport layer disposed between the anode and the light-emitting layer, wherein the hole transport layer has
      a first region adjacent to the anode, and
      a second region closer to the light-emitting layer than the first region is, the second region adjoining to the light-emitting layer,
   the first region has an ionization potential larger than an ionization potential of the second region and larger than an ionization potential of the light-emitting layer, and
   the hole transport layer has an ionization potential decreasing gradually from near the anode in the first region to near the light-emitting layer in the second region.

2. The light-emitting element according to claim 1, wherein
   the hole transport layer includes a metal oxide.

3. A light-emitting element comprising:
   an anode;
   a cathode;
   a light-emitting layer disposed between the anode and the cathode, the light-emitting layer containing quantum dots; and
   a hole transport layer disposed between the anode and the light-emitting layer, wherein
   the hole transport layer includes a metal oxide containing Ni,
   the hole transport layer has
      a first region adjacent to the anode, and
      a second region closer to the light-emitting layer than the first region is, the second region adjoining to the light-emitting layer, and
   in a composition of the metal oxide, a ratio of O to Ni in the first region is larger than a ratio of O to Ni in the second region.

4. The light-emitting element according to claim 3, wherein
   the metal oxide further contains magnesium nickel oxide.

5. The light-emitting element according to claim 3, wherein
the metal oxide further contains lanthanum nickel oxide.

6. The light-emitting element according to claim 4, wherein
the metal oxide is $Mg_XNi_{1-X}O$, where X satisfies $0 \leq X \leq 1$, and a value of X in the first region is larger than a value of X in the second region.

7. The light-emitting element according to claim 3, wherein
the hole transport layer has a thickness of 5 to 50 nm inclusive.

8. The light-emitting element according to claim 3, wherein
the hole transport layer includes
a first layer including the first region, and
a second layer including the second region.

9. The light-emitting element according to claim 8, wherein
the first and second layers each has a thickness of 5 to 15 nm inclusive.

10. The light-emitting element according to claim 8, wherein
the hole transport layer further has one or more layers disposed between the first and second layers.

11. The light-emitting element according to claim 1, wherein
the ionization potential of the second region is defined as $IP_{A2}$,
the ionization potential of the light-emitting layer is defined as $IP_{EML}$, and
$IP_{A2}$ and $IP_{EML}$ satisfy $IP_{A2} - IP_{EML} \geq -0.3$ eV.

12. The light-emitting element according to claim 1, wherein
the ionization potential of the second region is larger than the ionization potential of the light-emitting layer.

13. The light-emitting element according to claim 1, wherein
the ionization potential of the first region is equal to or less than 6.5 eV.

14. A light-emitting element comprising:
an anode;
a cathode;
a light-emitting layer disposed between the anode and the cathode, the light-emitting layer containing quantum dots; and
a hole transport layer disposed between the anode and the light-emitting layer, wherein
the hole transport layer has
a first region adjacent to the anode, and
a second region closer to the light-emitting layer than the first region is, the second region adjoining to the light-emitting layer,
the first region has an ionization potential larger than an ionization potential of the second region and larger than an ionization potential of the light-emitting layer, and
the first region has an electron affinity smaller than an electron affinity of the second region.

15. The light-emitting element according to claim 14, wherein
the hole transport layer has an electron affinity increasing gradually from near the anode in the first region to near the light-emitting layer in the second region.

16. The light-emitting element according to claim 14, wherein
the hole transport layer has an electron affinity increasing gradually from near the anode to near the light-emitting layer.

* * * * *